(12) United States Patent
Prabhat et al.

(10) Patent No.: US 10,181,848 B2
(45) Date of Patent: Jan. 15, 2019

(54) DIGITAL FORWARD BODY BIASING IN CMOS CIRCUITS

(71) Applicant: ARM Limited, Cambridge (GB)

(72) Inventors: Pranay Prabhat, Cambridge (GB); Parameshwarappa Anand Kumar Savanth, Cambridge (GB); James Edward Myers, Bottisham (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/418,331

(22) Filed: Jan. 27, 2017

(65) Prior Publication Data

US 2018/0219549 A1    Aug. 2, 2018

(51) Int. Cl.
  *H03K 17/687*   (2006.01)
  *H01L 29/10*    (2006.01)

(52) U.S. Cl.
  CPC ..... *H03K 17/6872* (2013.01); *H01L 29/1087* (2013.01); *H03K 2217/0036* (2013.01)

(58) Field of Classification Search
  CPC ........ H03K 17/6872; H03K 2217/0036; H01L 29/1087
  See application file for complete search history.

(56) References Cited

U.S. PATENT DOCUMENTS

| 6,300,819 B1* | 10/2001 | De ..................... H01L 27/0928 257/E27.067 |
| 2009/0108905 A1* | 4/2009 | Wang ................. H03K 19/0013 327/374 |

OTHER PUBLICATIONS

Zhao, et al.; Novel Self-Body-Biasing and Statistical Design for Near-Threshold Circuits With Ultra Energy-Efficient AES as Case Study; IEEE Transactions on Very Large Scale Integration (VLSI) Systems; vol. 23, Issue 8; Aug. 2015.
Fojtik, et al.; A Millimeter-Scale Energy-Autonomous Sensor System With Stacked Battery and Solar Cells; IEEE Journal of Solid-State Circuits; vol. 48, Issue 3; Mar. 2013.
Ananthan, et al.; Larger-than-Vdd Forward Body Bias in Sub-0.5V Nanoscale CMOS; ISLPED'04; 2004.

\* cited by examiner

*Primary Examiner* — Jung Kim
(74) *Attorney, Agent, or Firm* — Pramudji Law Group PLLC; Ari Pramudji

(57) ABSTRACT

Embodiments are described for digital forward body biasing CMOS circuits. In an embodiment, a power management unit limits the amount of time for which digital forward body biasing may be implemented. In another embodiment, once a CMOS circuit is put into a full digital forward body bias mode, the CMOS circuit is gradually brought back to a zero forward body bias mode. In another embodiment, charge is shared among biased transistor wells during transition intervals when transitioning from one bias mode to another.

17 Claims, 7 Drawing Sheets

DIGITAL FORWARD BODY BIASING IN CMOS CIRCUITS

BACKGROUND

Forward body biasing is a technique to increase performance of a Complementary Metal Oxide Semiconductor (CMOS) circuit, although power consumption may increase due to an increase in leakage current. During forward body biasing, the n-well of a pMOSFET (p-Metal-Oxide-Semiconductor Field Effect Transistor) is held at some voltage less than $V_{CC}$, the supply rail voltage; and the p-substrate of an nMOSFET (which may be an isolated portion of a p-doped bulk substrate) is held at some voltage greater than $V_{SS}$, the ground or substrate voltage.

Traditionally, the applied forward body bias is less in magnitude than a diode forward voltage drop, otherwise substrate diodes will become forward biased and the CMOS circuit may exhibit latchup, resulting in catastrophic behavior. However, with low voltage CMOS circuits in which the supply voltage is less than a diode forward voltage drop, for example about 0.5 V, it can be feasible to bias the n-wells and p-substrates at the supply rail and ground rail, respectively. This technique is often referred to as digital forward body biasing.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

When a CMOS circuit is in a standard operating mode, usually the n-well of a pMOSFET is coupled to a power rail (or supply rail) and the p-substrate (or p-well) of an nMOSFET is coupled to a ground rail (or substrate). This configuration may be referred to as a zero forward body bias mode.

In forward body biasing, the n-well is driven to a voltage lower than the supply voltage of the power rail, usually denoted as $V_{CC}$, and the p-substrate or p-well is driven to a voltage higher than the ground or substrate voltage, usually denoted as $V_{SS}$. Forward body biasing is a technique to increase the performance of a CMOS circuit, with the tradeoff of increased power consumption.

In digital forward body biasing, the n-well of a pMOSFET is coupled directly to a ground rail so that its voltage is driven to $V_{SS}$, and the p-well of an nMOSFET is coupled directly to a supply or power rail so that its voltage is driven to $V_{CC}$. Digital forward body biasing can be inherently power-hungry and may be risky due to the increased probability of latchup. Typically, a low-voltage system should not stay in a digital forward body bias mode for too long, and in practice digital forward body biasing should be used on a temporary basis when increased performance is needed.

In many instances, an on-chip power management unit controls forward body biasing, where in response to the assertion of a request signal, the power management unit generates a forward body bias signal to cause one or more CMOS circuit blocks on the chip to be in a digital forward body bias mode. The request signal may be generated by a software routine, or may be generated by dedicated circuits within the chip, or some combination thereof. If there is a system failure, the request signal may not be de-asserted in a timely manner, leading to unwanted power consumption and an increased risk of latchup. A system failure may be due to any one of a number of factors, such as: a software error, a digital logic glitch due to crosstalk or an undesirable IR (current resistance product) voltage drop, an unintended memory bit flip, and thermal damage from high substrate current due to excessive forward body bias (especially at high temperature), to name a few examples.

Figure 1:
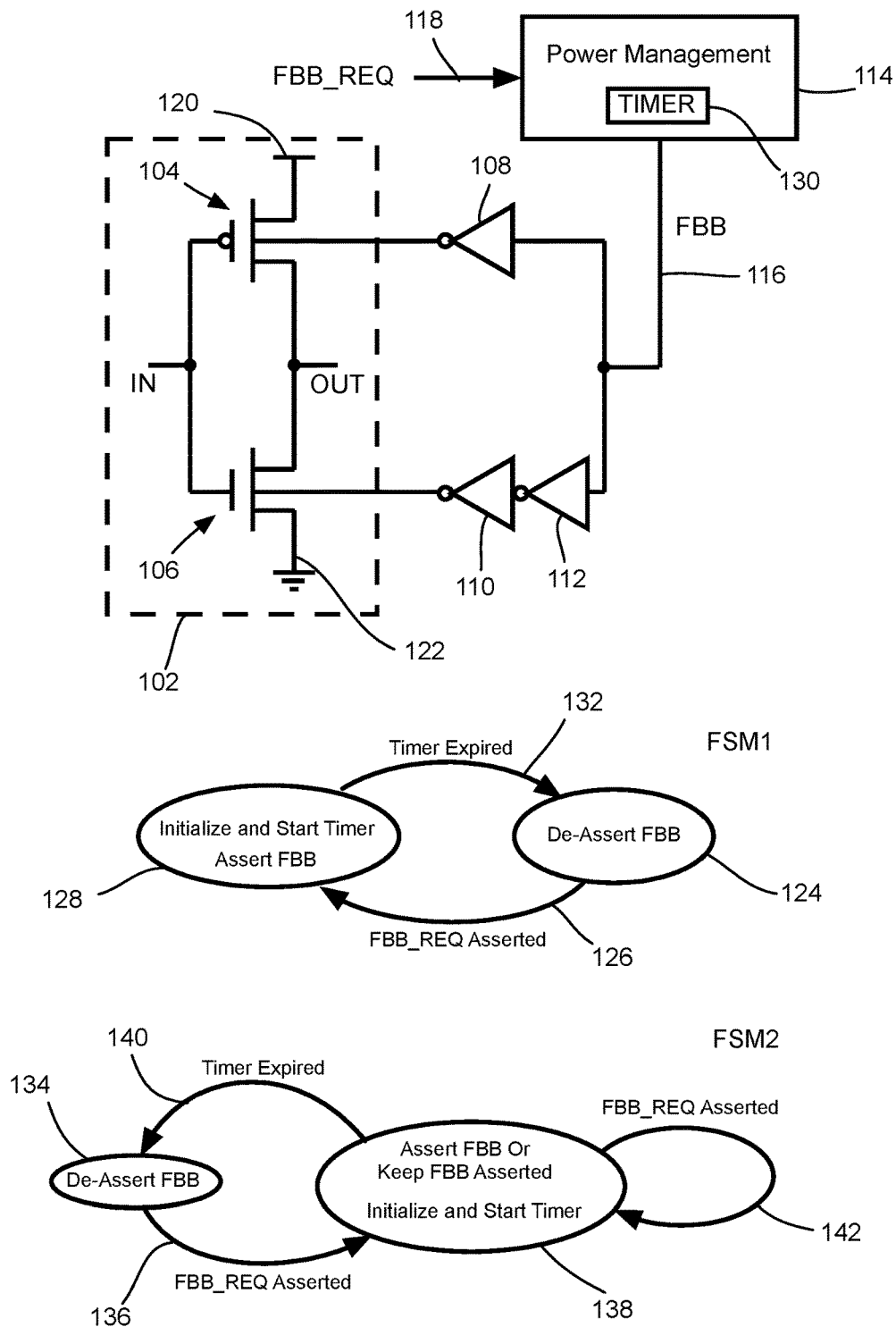
FIG. 1 illustrates digital forward body biasing a digital circuit in accordance with various implementations described herein.

Embodiments described herein mitigate the above-described risks by utilizing a power management unit that de-asserts a forward body bias signal according to various policies. A finite state machine may implement the policies. FIG. 1 illustrates an embodiment for digital forward body biasing a digital circuit 102. For ease of illustration, a simple inverter is illustrated in the digital circuit 102 comprising a pMOSFET 104 and an nMOSFET 106.

A driver 108 has its output port connected to the n-well of the pMOSFET 104. In the embodiment of FIG. 1, the driver 108 is an inverter. The combination of inverters 110 and 112 serves as a driver with an output port connected to the p-substrate of the nMOSFET 106. In general, it is convenient to refer to the p-substrate of an nMOSFET in a CMOS circuit as a p-well although a double-well process may not be used when fabricating the CMOS circuit. Accordingly, the output port of the combination of inverters 110 and 112 is connected to the p-well of the nMOSFET 106. The input ports of the inverters 108 and 112 are coupled to a power management unit 114 by way of a signal line 116. The signal (voltage or current) provided by the signal line 116 is the forward body bias signal and is labeled FBB.

The power management unit 114 provides the forward body bias signal, referred to as a FBB signal, in response to a forward body bias request signal on a signal line 118, where the forward body bias signal is labeled in FIG. 1 as FBB_REQ. When the FBB signal is de-asserted, that is, the FBB signal is LOW (the substrate or ground voltage $V_{SS}$ of a ground rail 122), the inverter 108 drives the n-well of the pMOSFET 104 HIGH, that is, to the supply voltage $V_{CC}$ of a supply rail 120. (HIGH and LOW refer to logic values, so that a HIGH voltage need not exactly equal the supply voltage $V_{CC}$ and a LOW voltage need not exactly equal the ground or substrate voltage $V_{SS}$.) Furthermore, when the FBB signal is de-asserted, the combination of inverters 110 and 112 drives the p-well of the nMOSFET 106 LOW. In effect, when the FBB signal is de-asserted, the n-well of the pMOSFET 104 is coupled to the supply rail 120 and the p-well of the nMOSFET 106 is coupled to the ground rail 122. This mode corresponds to a zero forward body bias mode.

When the FBB signal is asserted, that is, when the FBB signal is HIGH, the inverter 108 drives the n-well of the pMOSFET 104 LOW, and the combination of inverters 110 and 112 drives the p-well of the nMOSFET 106 HIGH. In effect, when the FBB signal is asserted, the n-well of the pMOSFET 104 is coupled to the ground rail 122 and the p-well of the nMOSFET 106 is coupled to the supply rail 120. This mode corresponds to a digital forward body bias mode.

The inverter 108 may be termed an n-well driver, and the combination of inverters 110 and 112 may be termed a p-well driver. These drivers may include simple inverter circuits as well as buffers.

FIG. 1 illustrates two policies that the power management unit 114 may implement, represented by a first finite state machine labeled FSM1 and a second finite state machine labeled FSM2. In FSM1, assume a state 124 is the initial state of the power management unit 114. In the state 124, the FBB signal is de-asserted (LOW) so that the circuit 102 is in its standard operating mode, that is, it is in a zero forward body bias mode.

When the FBB signal is asserted in response to the FBB_REQ signal transitioning HIGH, a transition 126 changes the state of the power management unit 114 from the state 124 to a state 128. When the FSM1 transitions to the state 128, a timer 130 is initialized (if it has not previously been initialized) and then started. When in the state 128, the FBB signal is asserted, so that the circuit 102 is in a digital forward body bias mode.

When the timer 130 expires, a transition 132 changes the state of the power management unit 114 from the state 128 back to the state 124 where the FBB signal is de-asserted (LOW) so that the circuit 102 is once again in a zero forward body bias mode.

Note from the state transition diagram for FSM1 that once the power management unit 114 transitions to the state 128, subsequent toggling of the FBB_REQ signal will not affect the amount of time for which the power management unit 114 stays in the state 128. The timer 130 will count some specified number of cycles, independent of the FBB_REQ signal, whereupon the FSM1 will undergo a state transition in response to the timer 130 expiring, e.g., when the value of some incrementing or decrementing register in the timer 130 eventually equals some specified threshold. Such a policy may be referred to as strict time-out policy, and an illustrative timing diagram is provided in FIG. 2.

Figure 2:
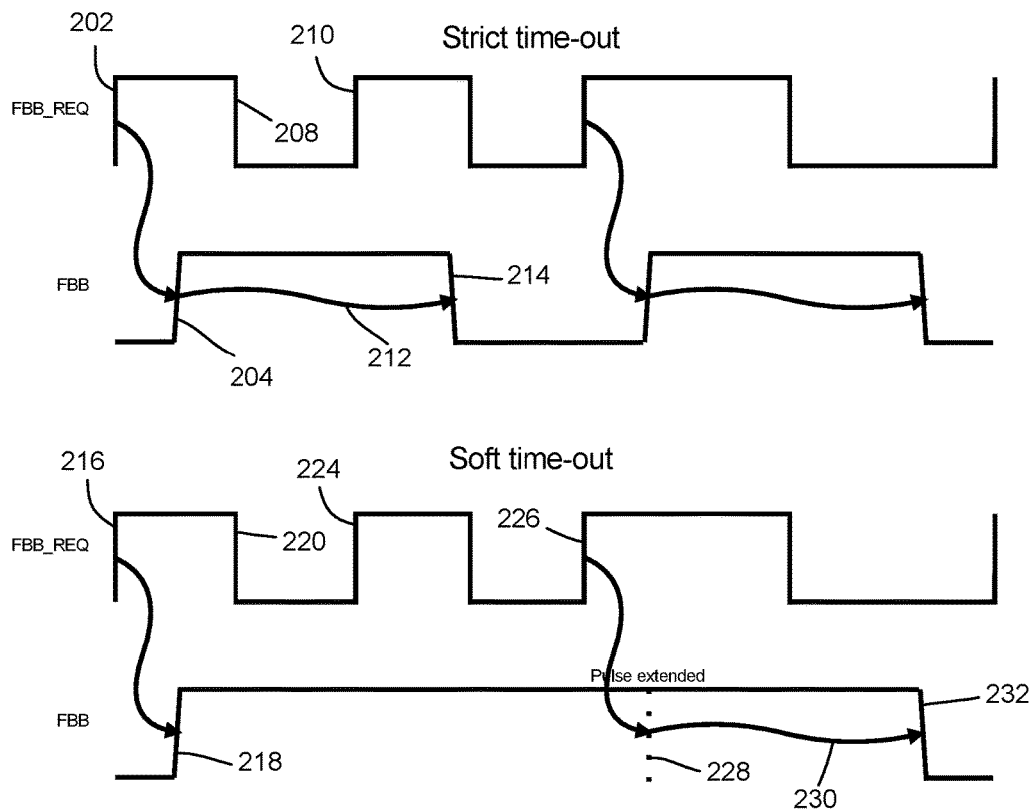
FIG. 2 illustrates timing diagrams for FIG. 1 in accordance with various implementations described herein.

Referring to the strict time-out timing diagram in FIG. 2 composed of timing diagrams for the FBB_REQ and FBB signals, in response to a rising edge 202 of the FBB_REQ signal, the FBB signal is asserted at a rising edge 204. The FBB_REQ is de-asserted at a falling edge 208 and then asserted again at a rising edge 210, but this toggling has no affect upon the time duration for which the FBB signal is asserted, as indicated by an arrow 212 of fixed time length. When the timer 130 expires, the FBB signal is de-asserted at a falling edge 214.

FIG. 1 explicitly includes the timer 130, where a multitude of circuits may be used for realizing the timer 130. For example, a register may be incremented or decremented based upon a clock signal or a closed loop of delay elements, where the timer 130 is determined to have expired based upon comparing the value of the register to some threshold. Generally, the FBB signal as illustrated in FIG. 2 may be described as a sequence of pulses, each pulse having some time interval. In response to each assertion of the FBB_REQ signal, the power management unit 114 outputs a pulse having some time interval so that the CMOS circuit 102 is put into a digital forward body bias mode during the time interval. This time interval may be programmable.

Referring back to FIG. 1, the state transition diagram FSM2 illustrates another policy for the power management unit 114. Suppose the power management unit 114 is initially in a state 134 where the FBB signal is de-asserted so that the circuit 102 is in a zero forward body bias mode. In a transition 136 where the FBB_REQ signal is asserted (a rising edge), the power management unit 114 transitions from the state 134 to a state 138. When transitioning to the state 138, the FBB signal is asserted (or it is kept asserted if it already is asserted) so that the circuit 102 is in a digital forward body bias mode, and the timer 130 is initialized (if it hasn't been previously initialized) and then started.

The power management unit 114 will transition from the state 138 back to the state 134 in a transition 140 in response to the timer 130 expiring. However, if before the timer expires the FBB_REQ signal is asserted, the power management unit 114 undergoes a transition 142 whereby it transitions from the state 138 back to the state 138, which means that the timer 130 is initialized before it has had a chance to expire. The timer 130 continues to count when in the state 138, but begins counting from its initial value because of the transition into the state 138. Such a policy may be termed a soft time-out policy.

Referring to the soft time-out timing diagram in FIG. 2 composed of timing diagrams for the FBB_REQ and FBB signals, in response to an assertion of the FBB_REQ signal at a rising edge 216, the FBB signal is asserted at a rising edge 218. The FBB_REQ is de-asserted at a falling edge 220 and then asserted again at a rising edge 224, which causes the timer to again initialize before it has expired. When the FBB_REQ signal rises again at a rising edge 226, the timer 130 is again initialized. Assertions of the FBB_REQ signal before the timer 130 has had a chance to expire cause the FBB signal to have an extended pulse. For example, the rise at 226 causes the timer 130 to be initialized at a time 228. An arrow 230 indicates that the timer 130 has expired before the FBB_REQ signal is again asserted, so that the FBB signal is de-asserted at a falling edge 232.

Appropriate pulse generator circuits for the power management unit 114 for both policies can be realized with CMOS logic gates. The pulse duration can be made programmable and delay elements can be chosen to track PVT (Process Voltage Temperature) variation. For example, at low temperature the leakage current is reduced, so that the FBB signal when asserted is tolerable for a longer duration and the pulse duration should increase. This can be accomplished by using representative logic gates as delay elements.

For simplicity, the policies represented by the timing diagrams of FIG. 2 show only timing diagrams for the FBB_REQ and FBB signals. In practice, voltage regulators, clock gates, and clock generators should also be appropriately configured before a transition in the FBB signal.

Figure 3:
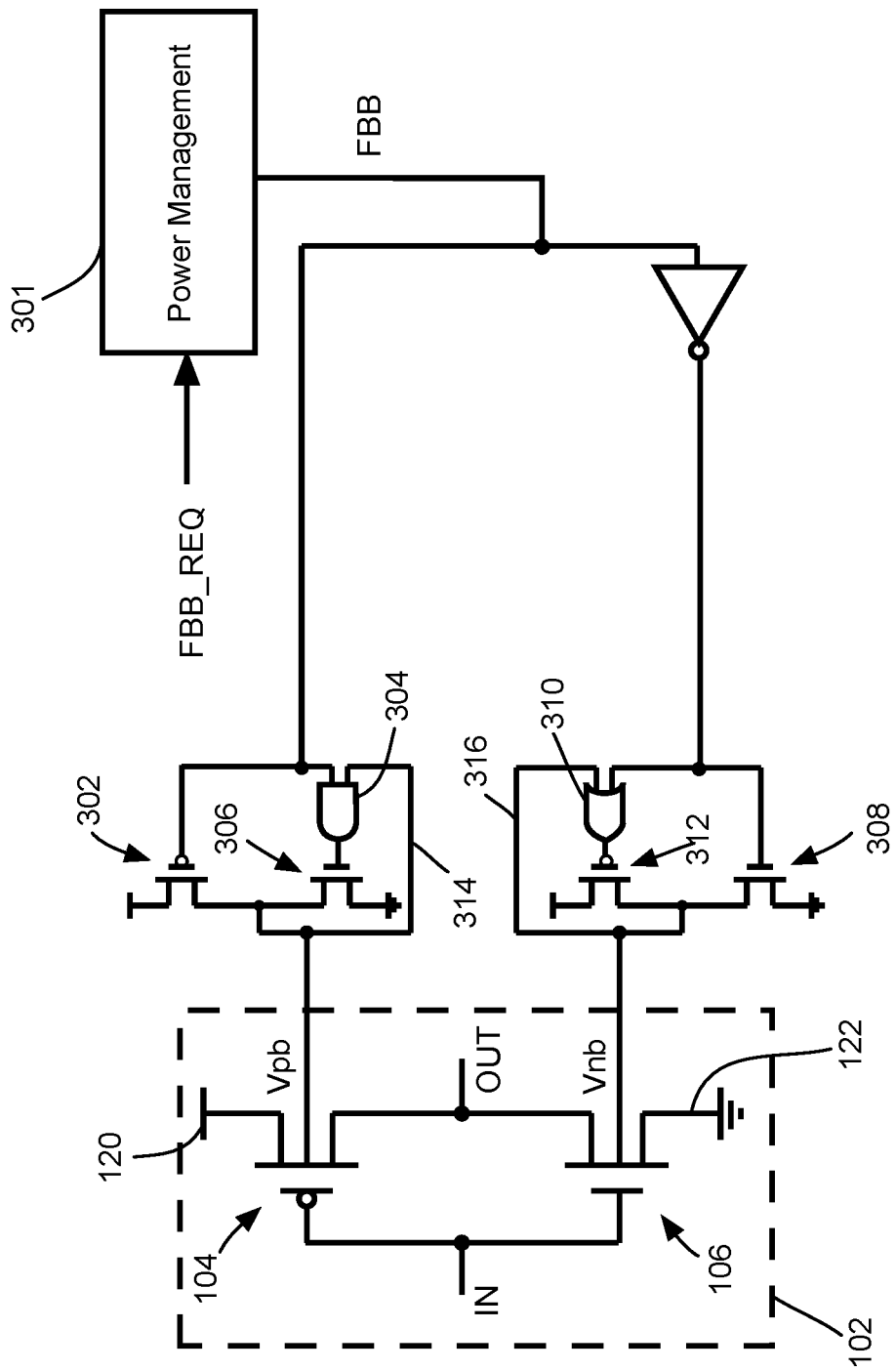
FIG. 3 illustrates digital forward body biasing a digital circuit with gradual transitions to a zero forward body bias mode in accordance with various implementations described herein.
Figure 4:
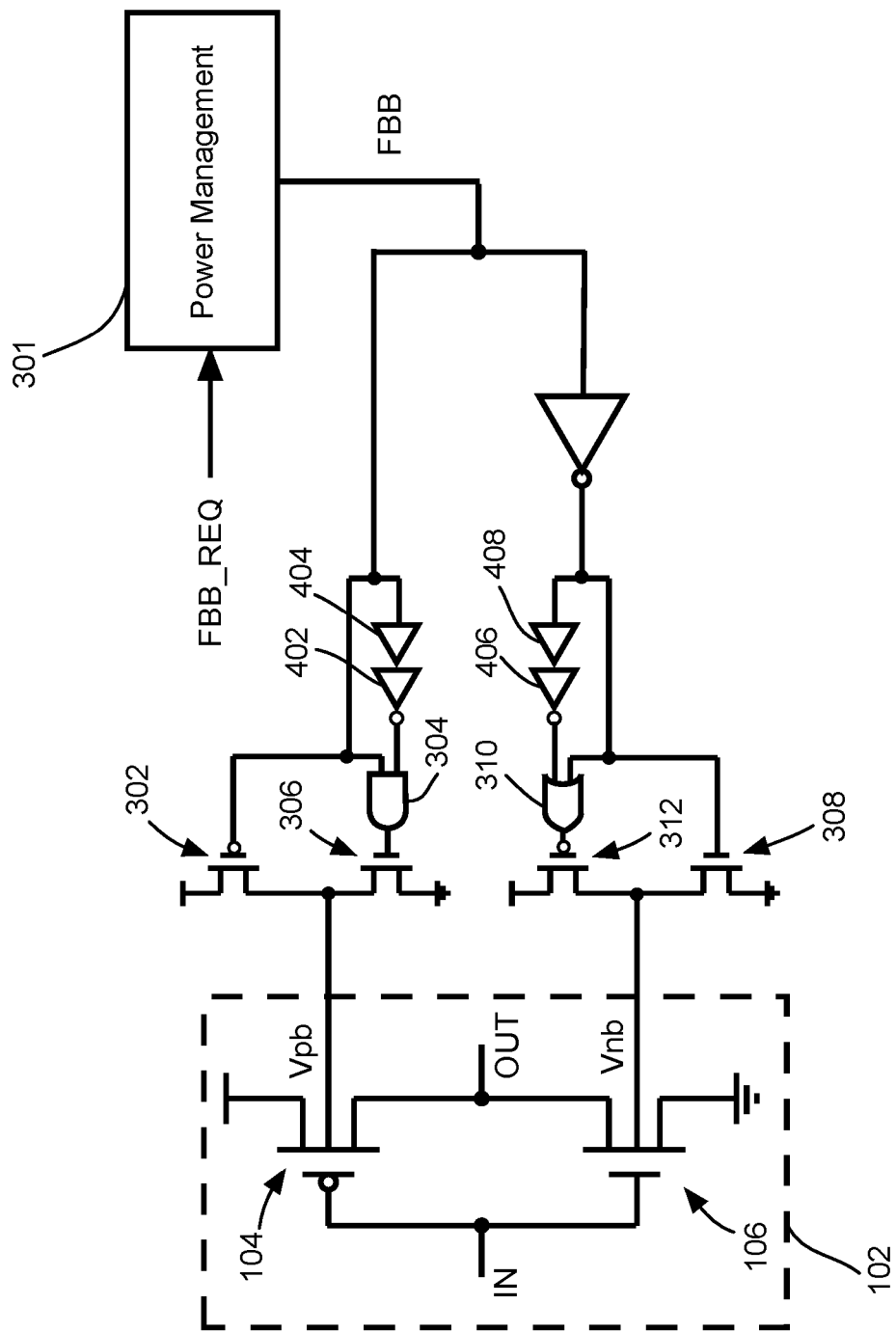
FIG. 4 illustrates digital forward body biasing a digital circuit with gradual transitions to a zero forward body bias mode in accordance with various implementations described herein.

For some embodiments, when a circuit is put into a digital forward body bias mode, the biasing of the n-wells and p-wells is gradually reduced to their normal operating values where the n-wells are coupled to the supply rail and the p-wells are coupled to the ground rail. FIGS. 3 and 4 illustrate this technique, where the embodiment of FIG. 3 utilizes a feedback path and the embodiment of FIG. 4 utilizes delay elements.

In describing the embodiment of FIG. 3, assume that initially the FBB signal is set to the voltage $V_{SS}$ (LOW) in response to the FBB_REQ signal being asserted LOW. With the FBB signal LOW, a pMOSFET 302 is ON, and one of the input ports to an AND gate 304 LOW. The output port of the AND gate 304 is connected to the gate of an nMOSFET 306, so that the nMOSFET 306 is OFF. Note that an input port of the AND gate 304 is connected to the gate of the pMOSFET 302 and another input port is connected by way of a feedback path 314 to the drain terminals of the pMOSFET 302 and nMOSFET 306. (The pMOSFET 302 may be referred to as a pull-up and the nMOSFET 306 may be referred to as a pull-down.) With the FBB signal LOW, the n-well of the pMOSFET 104 is at voltage $V_{CC}$ (HIGH), the voltage of the supply rail 120. In FIG. 3, $V_{pb}$ denotes the voltage of the n-well of the pMOSFET 104.

Furthermore, with the FBB signal LOW, an nMOSFET 308 is ON and one of the input ports to an OR gate 310 is HIGH. The output port of the OR gate 310 is connected to the gate of a pMOSFET 312. The output port of the OR gate 310 is connected to a gate of a pMOSFET 312, so that the pMOSFET 312 is OFF. Note that one of the input ports of the OR gate 310 is connected to the drain terminals of the nMOSFET 308 and pMOSFET 312, and that the other input port is connected to the gate of the nMOSFET 308. (The nMOSFET 308 may be referred to as a pull-down and the pMOSFET 312 may be referred to as a pull-up.) With the FBB signal LOW, the p-well of the nMOSFET 106 is at the voltage $V_{SS}$ of the ground rail 122. Thus, with the FBB signal LOW, the circuit 102 is in a zero forward body bias mode. In FIG. 3, $V_{nb}$ denotes the voltage of the p-well of the nMOSFET 106.

When the FBB_REQ signal is asserted HIGH, a power management unit 301 asserts the FBB signal HIGH. With the voltage $V_{pb}$ previously set to HIGH when the FBB signal was LOW, because of the feedback path 314 both input ports to the AND gate 304 are HIGH when the FBB signal is asserted HIGH, so that the nMOSFET 306 is ON. The pMOSFET 302 is OFF when the FBB signal is HIGH. With the nMOSFET 306 ON and the pMOSFET 302 OFF when the FBB signal is asserted HIGH, the voltage $V_{pb}$ of the n-well of the pMOSFET 104 is pulled LOW. This puts the pMOSFET 104 into a digital forward body bias mode.

Because of the feedback path 314, the AND gate 304 will switch OFF the nMOSFET 306 as $V_{pb}$ is pulled LOW. Thus, both nMOSFET 306 and pMOSFET 302 will be OFF when the $V_{pb}$ is pulled LOW. The pMOSFET 302 has a drain terminal connected to a drain terminal of the nMOSFET 306. The pMOSFET 302 is designed to have an off-state current (or leakage current) greater than that of the nMOSFET 306. As a result, $V_{pb}$ is gradually pulled up to HIGH, and the pMOSFET 104 will gradually be brought to a zero forward body bias mode. Eventually the FBB_REQ signal will again be asserted LOW so that the FBB signal is asserted LOW, in which case the pMOSFET 104 is maintained in a zero forward body bias mode where the pMOSFET 302 is ON to keep the voltage $V_{pb}$ HIGH.

Furthermore, when the power management unit 301 asserts the FBB signal HIGH in response to the FBB_REQ signal being asserted HIGH, the nMOSFET 308 is switched OFF. The n-well voltage $V_{nb}$ was previously LOW before the FBB signal is asserted HIGH, and because of the feedback path 316 both inputs to the OR gate 310 are LOW when the FBB signal is asserted HIGH so that the pMOSFET 312 is switched ON. With the pMOSFET 312 ON, the n-well voltage $V_{nb}$ is pulled HIGH. This puts the nMOSFET 106 into a digital forward body bias mode.

As the n-well voltage $V_{nb}$ is pulled HIGH, because of the feedback path 316 the OR gate 310 will switch pMOSFET 312 OFF. The pMOSFET 312 has a drain terminal connected to a drain terminal of the nMOSFET 308. The nMOSFET 308 is designed to have an off-state current greater than the pMOSFET 312, so that the n-well voltage $V_{nb}$ will gradually be pulled LOW. As a result, the nMOSFET 106 will gradually be brought to a zero forward body bias mode. Eventually the FBB_REQ signal will again be asserted LOW so that the FBB signal is asserted LOW, in which case the nMOSFET 106 is maintained in a zero forward body bias mode where the nMOSFET 308 is ON to keep the voltage $V_{nb}$ LOW.

In the embodiment of FIG. 3, the combination of pMOSFET 302 and nMOSFET 306 may be referred to as an n-well driver. The AND gate 304 or the feedback path 314, or the combination of both, could also be viewed as included with the pMOSFET 302 and the nMOSFET 306 in a n-well driver to provide bias to the n-well of the pMOSFET 104. Likewise, the combination of pMOSFET 312 and nMOSFET 308 may be referred to as a p-well driver. The OR gate 310 or the feedback path 316, or the combination of both, could also be viewed as included with the pMOSFET 312 and the nMOSFET 308 in a p-well driver to provide bias to the p-well of the nMOSFET 106.

Figure 5:
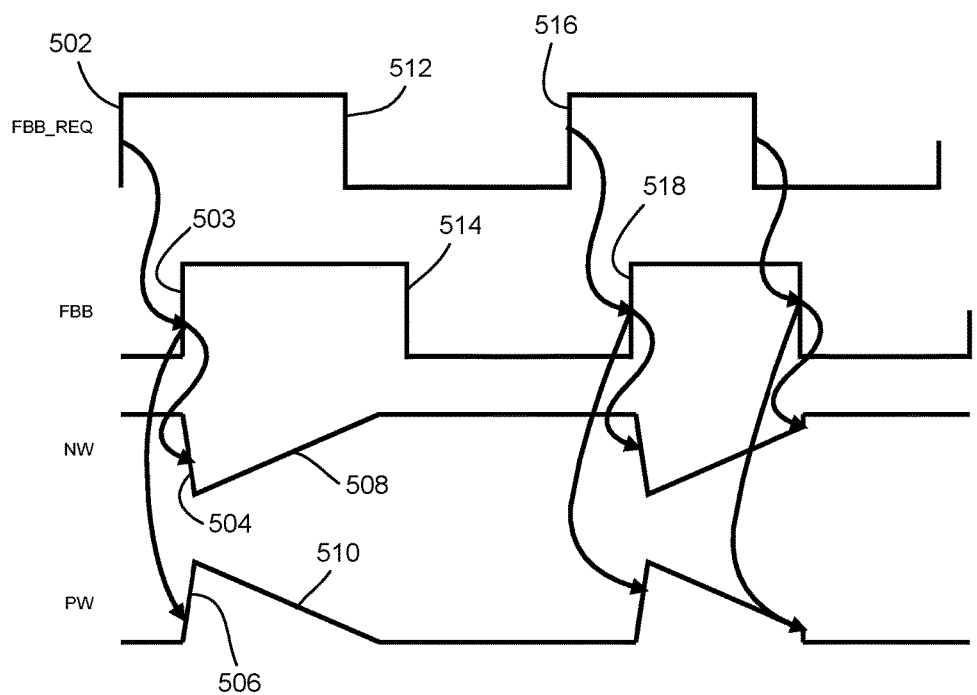
FIG. 5 illustrates timing diagrams for FIGS. 3 and 4 in accordance with various implementations described herein.

FIG. 5 illustrates timing diagrams for the n-well voltage $V_{pb}$ and the p-well voltage $V_{nb}$ in response to the FBB_REQ and FBB signals. The timing diagram labeled NW denotes the n-well voltage $V_{pb}$ and the timing diagram PW denotes the p-well voltage $V_{nb}$. At a transition 502 when the FBB_REQ signal is asserted HIGH, the power management unit 301 asserts the FBB signal HIGH as indicated in a transition 503. The n-well voltage $V_{pb}$ is pulled LOW as indicated by a transition 504, and the p-well voltage $V_{nb}$ is pulled HIGH as indicated by a transition 506. The circuit 102 is put into a digital forward body bias mode.

Because of the feedback paths 314 and 316, as discussed previously the n-well voltage $V_{pb}$ is gradually pulled to HIGH as indicated by a gradual transition 508 and the p-well voltage $V_{nb}$ is gradually pulled to LOW as indicated by a gradual transition 510. The circuit 102 is thus gradually put into a zero forward body bias mode. When the FBB_REQ signal is de-asserted LOW at a transition 512, the power management unit 301 de-asserts the FBB signal to LOW as indicated in a transition 514. With the FBB signal LOW, the pMOSFET 302 is ON and the nMOSFET 308 is ON to maintain the circuit 102 in a zero forward body bias mode so that the system is ready for a next assertion of the FBB_REQ and FBB signals as indicated by transitions 516 and 518, respectively. The process repeats in response to the signal assertions at transitions 516 and 518, where the circuit 102 is again put into a digital forward body bias mode, and then gradually brought back to a zero forward body bias mode.

FIG. 4 illustrates an embodiment similar to that of FIG. 3, but where delay lines are used instead of the feedback paths 314 and 316 of FIG. 3. In FIG. 4, a first delay line comprising an inverter 402 and a buffer 404 is coupled to an input port of the AND gate 304, and a second delay line comprising an inverter 406 and a buffer 408 is coupled to an input port of the OR gate 310. FIG. 5 illustrates the timing diagrams for the n-well voltage $V_{pb}$ and the p-well voltage $V_{nb}$ for the embodiment of FIG. 4 just as described for the embodiment of FIG. 3.

When the FBB signal is LOW, the circuit 102 is in a zero forward body bias mode. When the FBB signal is asserted HIGH, then as the FBB signal transitions from LOW to HIGH, the circuit 102 is put into a digital forward body bias mode where the nMOSFET 306 is ON and the pMOSFET 312 is ON. Because of the delay lines, soon after the circuit 102 is put into a digital forward body bias mode, the nMOSFET 306 and the pMOSFET 312 are switched OFF. As for the embodiment of FIG. 3, the off-state current for the pMOSFET 302 is greater than that of the nMOSFET 306, and the off-state current for the nMOSFET 308 is greater than that of the pMOSFET 312. The n-well voltages then transition gradually to their zero forward body bias values, where the n-well voltage $V_{pb}$ is gradually pulled to HIGH and the p-well voltage $V_{nb}$ is gradually pulled to LOW. The circuit 102 in FIG. 4 is thus gradually put into a zero forward body bias just as for the embodiment of FIG. 3.

In the embodiment of FIG. 4, the combination of pMOSFET 302 and nMOSFET 306 may be referred to as an n-well driver. The AND gate 304 or the delay elements 402 and 404, or the combination of both, could also be viewed as included with the pMOSFET 302 and the nMOSFET 306 in a n-well driver to provide bias to the n-well of the pMOSFET 104. Likewise, the combination of pMOSFET 312 and nMOSFET 308 may be referred to as a p-well driver. The OR gate 310 or the delay elements 406 and 408, or the combination of both, could also be viewed as included with the pMOSFET 312 and the nMOSFET 308 in a p-well driver to provide bias to the p-well of the nMOSFET 106.

For ease of illustration, for the particular embodiment of FIG. 4, only two delay elements 402 and 404 are shown coupling the FBB signal to an input port of the AND gate 304, and only two delay elements 406 and 408 are shown coupling the logical complement of the FBB signal to an input port of the OR gate 310. In practice, the number of delay elements is not so limited, and depending upon the process technology and design goals, any number of delay elements may be considered.

Furthermore, as is well known there is a multitude of ways in synthesizing a Boolean function with digital logic. For example, logic gates other than the AND gate 304 or the OR gate 310 may be used in the embodiments of FIGS. 3 and 4, provided there is proper use of other logic gates (including inverters) if needed so that the over-all functional behavior is maintained.

It is to be appreciated that the timing diagrams illustrated in FIG. 5 are meant to be illustrative in nature, where the various transitions depicted in FIG. 5 are not necessarily straight lines and where the turning points between the transitions are not necessarily so sharp. Furthermore, the slope of the various transitions for the embodiment of FIG. 3 need not necessarily be the same as for the embodiment of FIG. 4.

As discussed with respect to the embodiments of FIG. 3 and FIG. 4, off-state current (or leakage current) is used to slowly discharge the p-well of the nMOSFET 106 and to slowly charge the n-well of the pMOSFET 104 so that the circuit 102 is slowly brought to a zero forward body bias mode after having been put into a digital forward body bias mode. In this way, various embodiments described herein track PVT (Process Variation Temperature) variations. For example, if the system is at a slow-n fast-p corner, the n-well will be charged more quickly to limit the digital forward body bias of the pMOSFET 104. Furthermore, the p-well will be discharged more slowly, allowing the digital forward body bias of the nMOSFET to remain on for longer.

For the embodiments of FIG. 3 and FIG. 4, the pull-down nMOSFET 306 for the n-well of the pMOSFET 104 and the pull-up pMOSFET 312 for the p-well of the nMOSFET 106 should be able to put their respective wells into a full forward body bias before being cut off by the feedback paths (for the embodiment of FIG. 3) or enable pulses from the delay lines (for the embodiment of FIG. 4). This can be done through margin simulations and appropriate sizing of the feedback AND gates and OR gates or the enable pulse durations due to the delay lines. By controlling the trip point of the feedback gates or the enable pulse durations, various embodiments described herein may also realize partial forward body biasing by cutting off the biasing transition before the wells switch fully to their respective opposite rail voltages.

Depending on the leakage and performance characteristics of biasing, a gradual well charge or discharge as described with respect to the embodiments of FIG. 3 and FIG. 4 may be more power-efficient than rail-to-rail digital forward body biasing as for the embodiment of FIG. 1. In the gradual well charge and discharge case, it may be more difficult to generate the appropriate voltage regulator, clock generator, and clock gating signals. A voltage regulator output should be kept essentially constant. For the clock signals, a ring oscillator in the same wells as the circuit being biased may provide a clock output whose frequency tracks the well voltage levels.

For duty-cycled workloads, forward body biasing should be disabled once the system is no longer active. Forward body biasing may cause a fixed dynamic energy overhead from short-circuit transition current and well capacitance recharge. For relatively short workloads, this fixed dynamic energy overhead may be non-negligible. Embodiments employing a charge sharing technique as discussed below may reduce this overhead.

Figure 6:
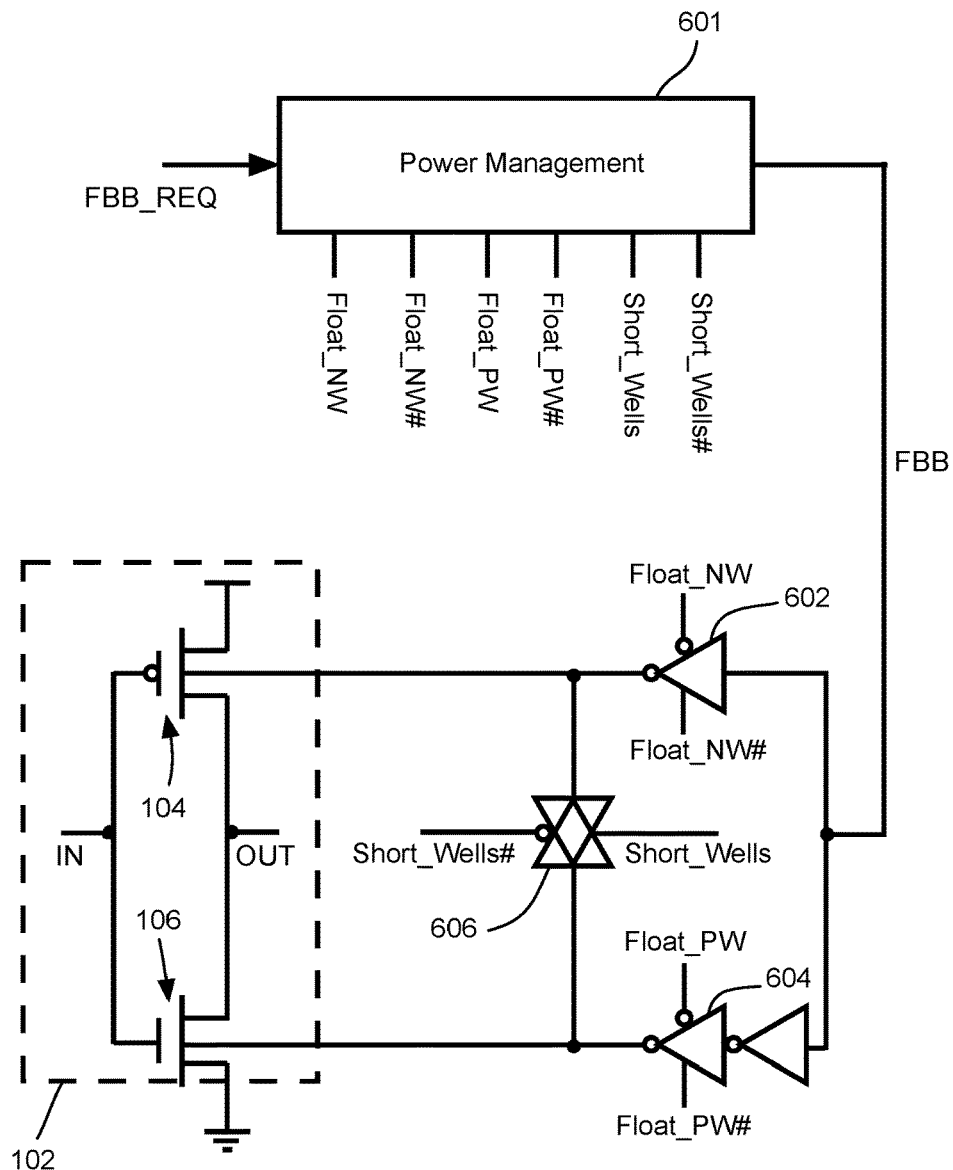
FIG. 6 illustrates digital forward body biasing a digital circuit utilizing charge sharing in accordance with various implementations described herein.

FIG. 6 illustrates an embodiment in which charge is shared between the n-well of the pMOSFET 104 and the p-well of the nMOSFET 106 during transition intervals from one biasing mode to another. When in a zero forward body bias mode, the FBB signal is LOW, a tri-state driver 602 is active, a tri-state driver 604 is active, and a transmission gate 606 is OFF (in a high impedance state). The tri-state driver 602 may be referred to as an n-well driver, and the tri-state driver 604 may be referred to as a p-well driver. The n-well driver 602 is put into its high impedance state when a Float_NW signal is asserted. In FIG. 6, the logical complement of the Float_NW signal is denoted as Float_NW#. Likewise, the p-well driver 604 is put into its high impedance state when a Float_PW signal is asserted, where its logical complement is denoted as Float_PW#. The transmission gate 606 is put into its low impedance state when a Short_Wells signal is asserted, where the logical complement of the Short_Wells signal is denoted as Short_Wells#.

FIG. 6 illustrates a power management unit 601 providing the signals FBB, Float_NW, Float_NW#, Float_PW, Float_PW#, Short_Wells, and Short_Wells#. However, these signals are not necessarily generated in an independent fashion, nor are these signals necessarily generated by the power management unit 601. For example, simple inverters can be used to generate the complementary signals, so that for any given signal, the power management unit 601 need not independently generate the complement. Furthermore, for some embodiments the signals Float_NW, Float_PW, and Short_Wells may be connected together so that all such signals are logically equivalent. That is, for some embodiments a single signal may represent all the signals Float_NW, Float_PW, and Short_Wells, and the complement of this single signal may represent Float_NW#, Float_PW#, and Short_Wells#.

When transitioning from a zero forward body bias mode to a digital forward body bias mode, there is a transition interval in which the drivers 602 and 604 are put into their high-impedance states and the transmission gate 606 is turned ON (low impedance state). Such a configuration couples the n-well of the pMOSFET 104 to the p-well of the nMOSFET 106 so that charge (following the usual convention that charge is positive) moves from the n-well to the p-well. That is, the n-well is effectively shorted to the p-well. During this transition interval, the Float_NW, Float_PW, and Short_Wells signals are each HIGH. As an example, the power management unit 601 may be hardwired or programmed (e.g., software or firmware) so that in response to the FBB_REQ signal being asserted, the Float_NW, Float_PW, and Short_Wells signals are each asserted HIGH.

After charge has been shared among the wells, the power management unit 601 de-asserts the Float_NW, Float_PW, and Short_Wells signals. Before de-asserting the Float_NW, Float_PW, and Short_Wells signals, the FBB signal is asserted HIGH so that when the Float_NW, Float_PW, and Short_Wells signals are LOW the n-well driver 602 couples the n-well of the pMOSFET 104 to $V_{SS}$ and the n-well driver 604 couples the p-well of the nMOSFET 106 to $V_{CC}$, thereby putting the circuit 102 fully into a digital forward body bias mode.

In response to the FBB_REQ signal being de-asserted LOW, the power management unit 601 begins another transition to once again put the circuit 102 into a zero forward body bias mode. As before, during the transition interval the power management unit 601 asserts the Float_NW, Float_PW, and Short_Wells signals HIGH so that the wells are coupled to each other. However, in this transition interval, charge moves from the p-well of the nMOSFET 106 to the n-well of the pMOSFET 104. After charge has been shared among the wells, the power management unit 601 de-asserts the Float_NW, Float_PW, and Short_Wells signals. Before de-asserting the Float_NW, Float_PW, and Short_Wells signals, the FBB signal is de-asserted LOW so that when the Float_NW, Float_PW, and Short_Wells signals are LOW the n-well driver 602 couples the n-well of the pMOSFET 104 to $V_{CC}$ and the n-well driver 604 couples the p-well of the nMOSFET 106 to $V_{SS}$, thereby putting the circuit 102 fully into a zero forward body bias mode.

Figure 7:
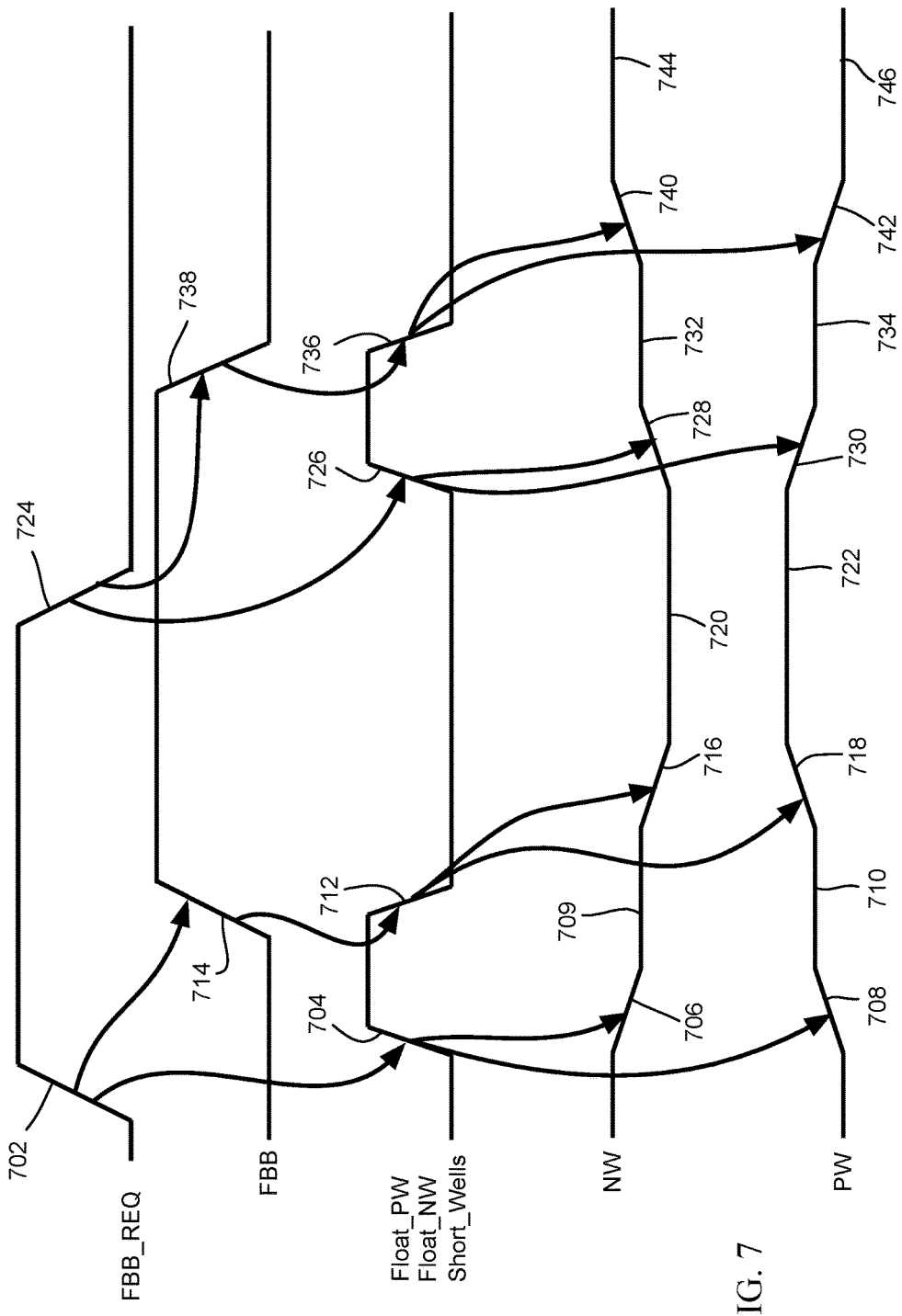
FIG. 7 illustrates timing diagrams for FIG. 6 in accordance with various implementations described herein.

FIG. 7 illustrates timing diagrams according to the embodiment of FIG. 6. The curve labeled with the Float_NW, Float_PW, and Short_Wells signals implies that these signals are asserted and de-asserted together, as are their logical complements. It is therefore convenient when referring to FIG. 7 to refer to the Float_NW, Float_PW, and Short_Wells signals collectively as float signals.

In a transition 702, the FBB_REQ signal transitions to HIGH, and in response, the power management unit 601 asserts the float signals HIGH as indicated in a transition 704. In response to the transition 704, the wells are connected together so that charge is shared among the wells. Transitions 706 and 708 represent charge sharing whereby the voltage of the n-well is reduced and the voltage of the p-well is increased.

Intervals 709 and 710 represent that the charge sharing is complete, whereupon the power management unit 601 de-asserts the float signals as indicated in transition 712. After the transition 702, but before the float signals are de-asserted, the power management unit asserts the FBB signal as indicated in transition 714. In this way when the float signals are de-asserted, the circuit 102 will be put into a forward body bias mode, where during a transition 716 the n-well is pulled down and during a transition 718 the p-well is pulled up. In the intervals 720 and 722, the n-well has been pulled down to $V_{SS}$ and the p-well has been pulled up to $V_{CC}$ so that the circuit 120 is fully in a digital forward body bias mode.

In a transition 724, the FBB_REQ transitions to LOW, and in response, the power management unit 601 in transition 726 asserts the float signals HIGH. This couples the wells together, where transitions 728 and 730 indicate that charge is shared among the wells so that the voltage of the n-well is increased and the voltage of the p-well is decreased. Regions 732 and 734 indicate completion of the charge sharing among the wells, and in a transition, 736 the power management unit 601 de-asserts the float signals to LOW.

After the transition 724 but before the transition 736, the power management unit 601 de-asserts the FBB signal to LOW as indicated in transition 738, whereupon the circuit 120 is brought to a zero forward body bias mode as indicated in transitions 740 and 742. The circuit 102 has been fully brought into a zero forward body bias mode in intervals 744 and 746.

The time interval from transition 704 to 712 need not be the same as the time interval from transition 726 to 736. That is, for some embodiments, the power management unit 601 may assert the float signals at transition 704 for some first time interval and de-assert the float signals upon expiration of the first time interval at transition 712, and the power management unit 601 may assert the float signals at transition 726 for some second time interval and de-assert the float signals upon expiration of the second time interval at transition 736, where the first and second time intervals need not necessarily have the same value.

As for the other timing diagrams, it is to be appreciated that the timing diagrams in FIG. 7 are illustrative in nature, where the various sharp turning points and straight-line transitions are not necessarily realized in practice.

The tri-state drivers 602 and 604 allow wells to be floated individually, or to be shorted together and floated, as discussed with respect to FIGS. 6 and 7. Shorting the wells together and allowing them to float can be an effective forward-biasing technique. By sharing charge among the wells when transitioning from a zero forward body bias mode to a digital forward body bias mode and back again, switching energy consumption is reduced. The total integrated product of charge with voltage drop per switching cycle is significantly reduced.

For example, assume that the n-wells and p-wells exhibit the same capacitance C, and that one-half of the initial charge moves from the higher potential well to the lower potential well when the wells are shorted to each other and floated. Then, for each biased transistor the ideal energy dissipation per bias mode change is $CV^2/2$, where V is the rail-to-rail voltage drop $V_{CC}-V_{SS}$. This is to be contrasted for the case where there is no charge sharing, so that for each biased transistor the total charge CV is dumped from rail to rail in a bias mode change, resulting in an ideal energy dissipation of $CV^2$.

In describing the various embodiments disclosed herein, reference has been made to MOSFETs, but it is to be understood that more generally a MOSFET may be considered an IGFET (Insulated Gate Field Effect Transistor), where for example the gate need not necessarily comprise a metal. Accordingly, embodiments described herein are not limited to MOSFETs and may find application to a wide variety of field effect transistors. Furthermore, the various embodiments have referred to asserting or de-asserting various signals. However, circuits are easily constructed where instead of asserting a signal to achieve some result, a signal may instead be de-asserted to achieve the same result. Accordingly, circuits may easily be designed where a transition of a first type where a signal goes from LOW to HIGH, or a transition of a second type where a signal goes from HIGH to LOW, may be utilized to achieve an intended result, such for example to put a CMOS circuit into a digital forward body bias mode.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims. It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of an integrated circuit including an FET, a driver coupled to the FET, and a power management unit. The power management unit is coupled to the driver so that in response to a transition of a request signal, the driver puts the FET into a digital forward body bias mode for a time interval and puts the FET into a zero forward body bias mode upon expiration of the time interval.

Described herein are various implementations of an integrated circuit including an FET, a driver coupled to the FET, and a power management unit. The power management unit includes a timer. The power management unit sets and runs the timer in response to transitions of a first type of a request signal, wherein the power management unit is coupled to the driver so that the driver puts the FET into a digital forward body bias mode in response to the timer running and puts the FET into a zero forward body bias mode in response to the timer expiring.

Described herein are various implementations of an integrated circuit including a supply rail, a ground rail, a pMOSFET having an n-well, an n-well driver, and a power management unit. The n-well driver includes a pull-up pMOSFET having a drain terminal and an off-state current, and a pull-down nMOSFET having a drain terminal and an off-state current less in magnitude than the off-state current of the pull-up pMOSFET. The drain terminals of the pull-up pMOSFET and pull-down nMOSFET are each connected to the n-well of the pMOSFET. The power management unit is coupled to the n-well driver so that when a request signal is at a first logic value, the pull-up pMOSFET is ON to couple the n-well of the pMOSFET to the supply rail and the pull-down nMOSFET is OFF, and in response to the request signal transitioning from the first logic value to a second logic value, the pull-up pMOSFET is switched OFF and the pull-down nMOSFET is switched ON to couple the n-well of the pMOSFET to the ground rail.

Described herein are various implementations of an integrated circuit including a pMOSFET having an n-well, an nMOSFET having a p-well, an n-well driver coupled to the n-well of the pMOSFET, a p-well driver coupled to the p-well of the nMOSFET, a transmission gate to couple the n-well of the pMOSFET to the p-well of the nMOSFET, and a power management unit. The power management unit is coupled to the n-well driver, the p-well driver, and the transmission gate. In response to a request signal transitioning from a first logic value to a second logic value, the power management unit for a first time interval puts the n-well driver and the p-well driver into a high impedance state, and puts the transmission gate into a low impedance state to couple the n-well of the pMOSFET to the p-well of the nMOSFET.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described herein are disclosed as example forms of implementing the claims.

What is claimed is:

1. A circuit comprising:
   an FET (Field Effect Transistor);
   a driver coupled to the FET; and
   a power management unit coupled to the driver so that in response to a transition of a request signal, the driver puts the FET into a digital forward body bias mode for a time interval and puts the FET into a zero forward body bias mode upon expiration of the time interval, and wherein the driver puts the FET into the zero forward body bias mode upon expiration of the time interval independent of subsequent transitions of the request signal.

2. The circuit as set forth in claim 1, wherein the transition of the request signal is an assertion of the request signal from a first voltage to a second voltage higher than the first voltage.

3. The circuit as set forth in claim 1, wherein the power management unit comprises a timer, wherein the timer provides the time interval.

4. The circuit as set forth in claim 1, wherein the FET is a pMOSFET (Metal Oxide Semiconductor Field Effect Transistor) comprising an n-well, and wherein the driver is an n-well driver coupled to the n-well of the pMOSFET.

5. The circuit as set forth in claim 4, further comprising:
   a supply rail;
   a ground rail;
   an nMOSFET having a p-well; and
   a p-well driver coupled to the p-well of the nMOSFET,
   wherein in response to the transition of the request signal, the n-well driver couples the n-well of the pMOSFET to the ground rail and the p-well driver couples the p-well of the nMOSFET to the supply rail, and wherein upon expiration of the time interval, the n-well driver couples the n-well of the pMOSFET to the supply rail and the p-well driver couples the p-well of the nMOSFET to the ground rail.

6. A circuit comprising:
   an FET (Field Effect Transistor);
   a driver coupled to the FET; and
   a power management unit comprising a timer, wherein the power management unit sets and runs the timer in response to transitions of a first type of a request signal, wherein the power management unit is coupled to the driver so that the driver puts the FET into a digital forward body bias mode in response to the timer running and puts the FET into a zero forward body bias mode in response to the timer expiring.

7. The circuit as set forth in claim 6, wherein the transitions of the first type of the request signal are assertions of the request signal from a first voltage to a second voltage higher than the first voltage.

8. The circuit as set forth in claim 6, wherein the power management unit runs the timer independently of transitions of a second type of the request signal.

9. The circuit as set forth in claim 8, wherein the transitions of the first type of the request signal are assertions of the request signal from a first voltage to a second voltage higher than the first voltage, and the transitions of the second type of the request signal are assertions of the request signal from the second voltage to the first voltage.

10. The circuit as set forth in claim 6, wherein the FET is a pMOSFET (Metal Oxide Semiconductor Field Effect Transistor) comprising an n-well, and wherein the driver is an n-well driver coupled to the n-well of the pMOSFET.

11. The circuit as set forth in claim 10, further comprising:
    a supply rail;
    a ground rail;
    an nMOSFET having a p-well; and
    a p-well driver coupled to the p-well of the nMOSFET,
    wherein the n-well driver couples the n-well of the pMOSFET to the ground rail and the p-well driver couples the p-well of the nMOSFET to the supply rail in response to the timer running, and wherein the n-well driver couples the n-well of the pMOSFET to the supply rail and the p-well driver couples the p-well of the nMOSFET to the ground rail in response to the timer expiring.

12. The circuit as set forth in claim 6, wherein expiration of the timer is based upon the timer counting to a threshold.

13. A circuit comprising:
a supply rail;
a ground rail;
a pMOSFET (Metal Oxide Semiconductor Field Effect Transistor) having an n-well;
an n-well driver comprising:
   a pull-up pMOSFET having a drain terminal and an off-state current; and
   a pull-down nMOSFET having a drain terminal and an off-state current less in magnitude than the off-state current of the pull-up pMOSFET, wherein the drain terminals of the pull-up pMOSFET and pull-down nMOSFET are each connected to the n-well of the pMOSFET; and
a power management unit coupled to the n-well driver so that when a request signal is at a first logic value, the pull-up pMOSFET is ON to couple the n-well of the pMOSFET to the supply rail and the pull-down nMOSFET is OFF, and in response to the request signal transitioning from the first logic value to a second logic value, the pull-up pMOSFET is switched OFF and the pull-down nMOSFET is switched ON to couple the n-well of the pMOSFET to the ground rail, and wherein when the request signal is at the second logic value, the n-well driver further switches OFF the pull-down nMOSFET.

14. The circuit as set forth in claim 13, the n-well driver further comprising:
a logic gate having a first input port coupled to the drain terminals of the pull-up pMOSFET and the pull-down nMOSFET, a second input port coupled to a gate of the pull-up pMOSFET, and an output port coupled to a gate of the pull-down nMOSFET.

15. The circuit as set forth in claim 13, the n-well driver further comprising:
a delay element; and
a logic gate having a first input port coupled to the delay element, a second input port coupled to a gate of the pull-up pMOSFET, and an output port coupled to a gate of the pull-down nMOSFET.

16. The circuit as set forth in claim 13, further comprising:
an nMOSFET having a p-well; and
a p-well driver comprising:
   a pull-up pMOSFET having a drain terminal and an off-state current; and
   a pull-down nMOSFET having a drain terminal and an off-state current greater in magnitude than the off-state current of the pull-up pMOSFET, wherein the drain terminals of the pull-up pMOSFET and pull-down nMOSFET in the p-well driver are each connected to the p-well of the nMOSFET,
wherein the power management unit is coupled to the p-well driver so that when the request signal is at the first logic value, the pull-up pMOSFET of the p-well driver is OFF and the pull-down nMOSFET of the p-well driver is ON to couple the p-well of the nMOSFET to the ground rail, and in response to the request signal transitioning from the first logic value to the second logic value, the pull-down nMOSFET of the p-well driver is switched OFF and the pull-up pMOSFET of the p-well driver is switched ON to couple the p-well of the nMOSFET to the supply rail.

17. The circuit as set forth in claim 16, wherein when the request signal is at the second logic value, the p-well driver further switches OFF the pull-up pMOSFET of the p-well driver.

* * * * *